United States Patent [19]

Kane

[11] 3,917,960

[45] Nov. 4, 1975

[54] MOS TRANSISTOR LOGIC CIRCUIT

[75] Inventor: James F. Kane, San Jose, Calif.

[73] Assignee: Signetics Corporation, Sunnyvale, Calif.

[22] Filed: Jan. 31, 1974

[21] Appl. No.: 438,266

[52] U.S. Cl. .................. 307/238; 307/279; 307/296

[51] Int. Cl.² .................. H03K 17/00; H03K 3/353

[58] Field of Search ........... 307/205, 238, 251, 279, 307/307, 296

[56] References Cited

UNITED STATES PATENTS

| | | | |
|---|---|---|---|
| 3,588,846 | 6/1971 | Linton | 307/279 X |
| 3,594,736 | 7/1971 | Hoffman | 307/238 X |

*Primary Examiner*—John Zazworsky
*Attorney, Agent, or Firm*—Flehr, Hohbach, Test, Albritton & Herbert

[57] ABSTRACT

Power dissipation of a MOS circuit is substantially reduced by providing for logic signal stand by control. Such circuit effectively disconnects the supply voltage from one of the terminals of the load resistors of the MOS circuit. Where the circuit is being used as a memory, this disconnection is not complete in that sufficient voltage is maintained to provide for information retention. In the case where the MOS circuit is used as a switching device where speed is important discharge of capacitive voltage is provided in the stand by control condition.

5 Claims, 2 Drawing Figures

MOS TRANSISTOR LOGIC CIRCUIT

BACKGROUND OF THE INVENTION

The present invention is directed to an MOS transistor logic circuit and more specifically to a power reduction technique for MOS integrated circuits.

In a typical MOS circuit which may be, for example, a memory cell or a switch for interfacing a program register with a data bus, the normal supply voltage is nominally 17 volts. Most MOS circuits in order to provide good temperature tracking especially in integrated configurations utilize a separate MOS device or transistor as a resistive load with, for example, the gate and drain connected together. In a stand by condition there may be substantial power dissipation. One obvious solution to the above is to turn off the power supply. But because of the magnitude of the power supply voltage, this involves complicated switching problems.

OBJECTS AND SUMMARY OF THE INVENTION

It is, therefore, an object of the present invention to provide an improved power reduction technique for MOS circuits.

It is another object of the invention to provide a power reduction technique for MOS circuits which requires only switching of a relatively low magnitude logic signal as opposed to modifying the total power supply.

In accordance with the above objects there is provided a MOS transistor logic circuit where MOS transistor cell means include at least one pair of series connected MOS devices having gate, source and drain terminals. One device of such pair is connected to a voltage source and in a normal operating condition serves as a resistive load for the other device of the pair whereby power is continuously dissipated. Stand by control means comprise a pair of series connected MOS devices with a predetermined resistive ratio. One of the devices has a control input for receiving a logic control signal for switching the cell means between the normal condition and a stand by condition where substantially less power is dissipated. The stand by control means connect a terminal of the resistive load MOS device to the voltage source in response to a normal logic control signal and substantially disconnect such terminal from the voltage source in response to a stand by logic control signal.

DETAILED DESCRIPTION OF THE PREFERRED EMBODIMENTS

Figure 1:
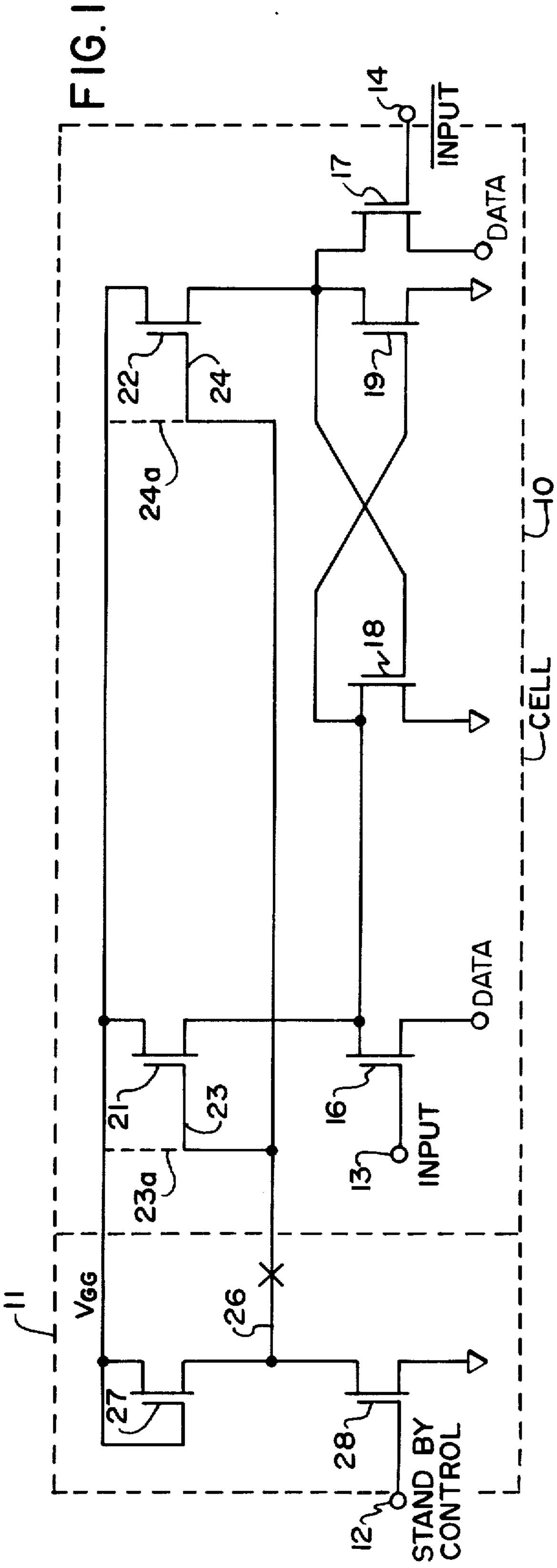
FIG. 1 is a circuit schematic of one embodiment of the invention.

FIG. 1 illustrates a MOS integrated circuit which includes a memory cell circuit 10 and a stand by control unit 11 having a stand by control input terminal 12. The complementary inputs to the memory cell 10 are at the gate terminals 13 and 14. These gate inputs through their respective MOS field effect type transistors 16 and 17 drive the bistable memory switching circuit which includes MOS transistors 18 and 19 which are cross-coupled in a manner well-known in the art. In addition, the memory circuit includes the MOS transistor load gates 21 and 22 which serve as resistive loads for the devices 18 and 19.

In the configuration of the prior art, the gate terminals 23 and 24 of the respective transistors 21 and 22 would be coupled to the voltage source, $V_{GG}$, as illustrated by the dashed lines 23*a* and 24*a*. However, in accordance with the present invention these gate terminals 23 and 24 are connected on a common bus 26 to the stand by control unit 11; specifically to the midpoint of the MOS devices 27 and 28, which are series connected, with the source of MOS device 27 being coupled to the drain of device 28. The gate terminal of transistor 28 is the stand by control terminal 12. The gate terminal of device 27 is connected to its drain terminal which in turn is connected to the voltage source, $V_{GG}$, device 27 thus serving as a resistive load for device 28.

The ratios of the resistances of devices 27 and 28 are chosen to provide a resistive ratio when device 28 is in a conductive condition to reduce $V_{GG}$ to, for example, two fifths of its initial value so that the voltage applied to gate terminals 23 and 24 via bus 26 is substantially reduced to reduce power dissapation. Moreover, the ratio is adjustable depending on the circuit context so that the information stored in the memory cell 10 is retained. The exact ratio will, of course, depend on the specific circuit.

In the stand by control condition with device 28 conductive, a small current will flow through the series connected devices 27 and 28. However, this is relatively small compared to the normal stand by power dissipation of the memory cell 10. When it is desired to restore the memory cell 10 to its normal operating condition, a logic control signal of, for example 3.2 volts magnitude, is applied to stand by control terminal 12 to place device 28 in its nonconductive condition whereby line 26 is effectively connected to the full supply voltage, $V_{GG}$. The devices 21 and 22 serve in this normal operating mode as normal load gates or load resistors. Thus the series connected stand by transistors 27 and 28 are responsive to a standby logic control signal to essentially disconnect the gate terminals 23 and 24 from the voltage source, $V_{GG}$. Such substantial disconnection is not complete in that a sufficient voltage is maintained to retain stored information in memory cell 10.

Figure 2:
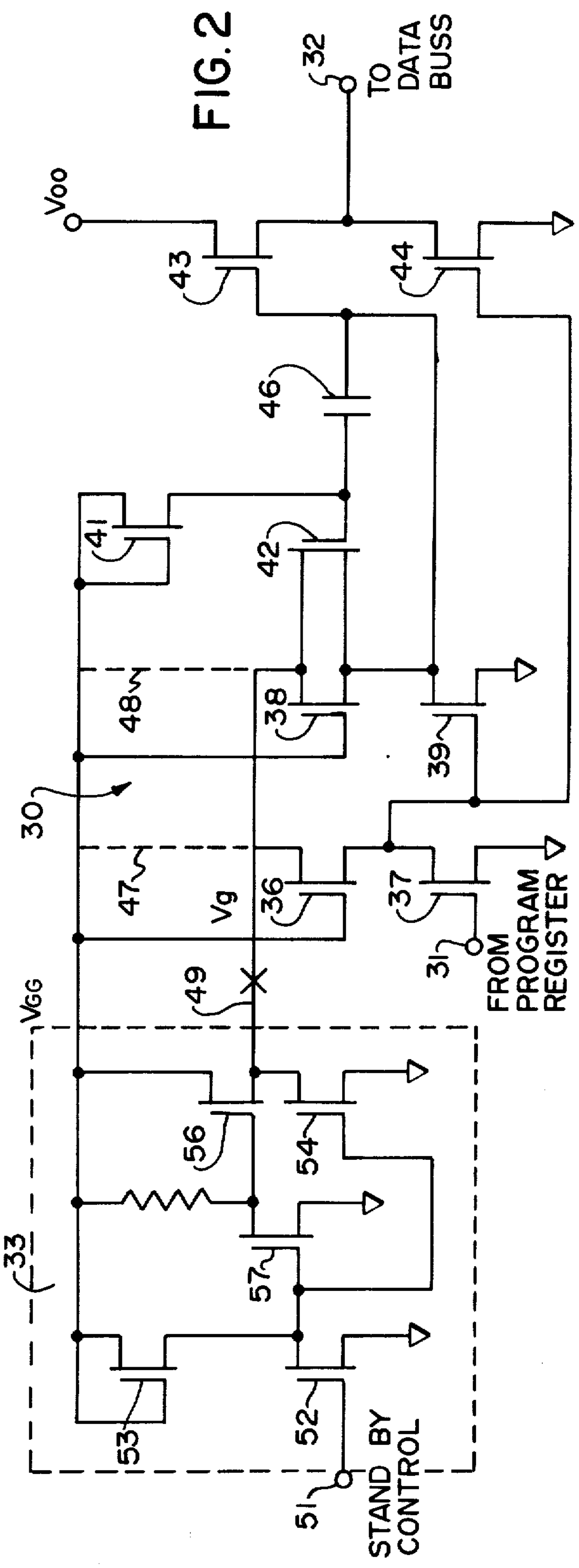
FIG. 2 is a circuit schematic of another embodiment of the invention.

The embodiment of FIG. 2 illustrates a program register data bus switch generally indicated at 30 which interfaces the input from a program register at terminal 31 to the data bus at terminal 32. Thus, this type of MOS cell requires no retention of stored information. In order to reduce power when the program register is isolated from the data bus, the stand by power control is employed.

Cell 30 includes a first pair of MOS deivces 36 and 37 and a second pair of series connected MOS devices 38 and 39. The gate terminal of device 37 is connected to input terminal 31. The remaining MOS transistors 41 through 44 and the capacitor 46 act as a buffer between the data bus 32 and the program register input terminal 31. Such switch would normally in the prior art be connected with the drain terminals of transistors 36 and 38 connected to voltage source $V_{GG}$ as shown by the dashed lines 47 and 48. However, in accordance with the invention, these drain terminals are instead connected on the bus 49 through the connection to stand by control means 33.

Such means include a stand by control terminal 51 which drives the gate of MOS transistor 52 which is series connected to load gate transistor 53 in a manner similar to the stand by control unit 11 of FIG. 1. However, instead of providing a reduced $V_{GG}$ to bus 49, stand by control unit 33 grounds the bus 49 through the MOS device 54 when a stand by logic control signal is received on terminal 51 to thereby discharge any capacitive voltage. In normal operation transistor 54 is in a nonconductive condition with transistor 56 being conductive to provide an effective voltage on bus 49 of $V_{GG}$. Thus, transistor 57 acts as a phase splitter to provide this complementary operation of transistors 54 and 56. The gate of transistor 57 is driven from the midpoint of series connected transistors 52 and 53. Thus in operation the circuit of FIG. 2 in a standby control condition fully disconnects the bus 49 from the voltage source $V_{GG}$ to minimize power dissipation.

I claim:

1. A MOS transistor logic circuit comprising: MOS transistor cell means including at least one pair of MOS devices each having gate, source and drain terminals with respective source and drain terminals connected to form a series connection, one of such pair having one of its remaining terminals, not connected to said other device of such pair, connected to a power supply voltage source and in a normal operating condition serving only as a resistive load for the other device of the pair whereby power is continuously dissipated, said other device having logic input means which is the sole such means of said pair; stand-by control means comprising a pair of MOS devices with respective source and drain terminals connected to form a series connection, said devices having a predetermined resistive ratio, one of such devices having a control input for receiving a logic control signal for switching said cell means between said normal condition and a stand by condition where substantially less power is dissipated, said stand-by control means connecting the other remaining terminal of said resistive load MOS device to said power supply voltage source in response to a normal logic control signal and for substantially disconnecting such terminal from said voltage source in response to a stand by logic control signal.

2. A logic circuit as in claim 1 where said MOS devices of said cell means store binary data and where said substantial disconnection reduces the magnitude of the voltage applied to said terminal substantially but provides sufficient voltage to cause said cell means to retain said data in said stand-by condition.

3. A logic circuit as in claim 2 where said terminal which is substantially disconnected is said gate terminal, such gate terminal being connected to said series connected pair of MOS devices of said stand-by control means at their midpoint connection whereby said resistive ratio determines said reduced voltage magnitude.

4. A logic circuit as in claim 1 where said stand-by control means includes means for grounding said disconnected terminal in said standby condition.

5. A logic circuit as in claim 4 where said terminal is said drain terminal of said MOS device of said cell means.

* * * * *